US012707743B2

(12) United States Patent
Chen et al.

(10) Patent No.: US 12,707,743 B2
(45) Date of Patent: Aug. 11, 2026

(54) SEMICONDUCTOR IMAGE-SENSING STRUCTURE HAVING ELECTRO-OPTICAL MODULATOR AND IMAGE SENSOR DEVICE HAVING THE SAME

(71) Applicant: TAIWAN SEMICONDUCTOR MANUFACTURING COMPANY LTD., Hsinchu (TW)

(72) Inventors: Wei-Lin Chen, Tainan City (TW); Chun-Hao Chou, Tainan City (TW); Kuo-Cheng Lee, Tainan City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 634 days.

(21) Appl. No.: 17/818,266

(22) Filed: Aug. 8, 2022

(65) Prior Publication Data

US 2024/0047495 A1 Feb. 8, 2024

(51) Int. Cl.
*H10F 39/00* (2025.01)
*H10F 39/18* (2025.01)

(52) U.S. Cl.
CPC ..... *H10F 39/8063* (2025.01); *H10F 39/8053* (2025.01); *H10F 39/184* (2025.01)

(58) Field of Classification Search
CPC .... H10F 39/8063; H10F 39/184; H10F 19/75; H10F 30/2635; H10F 39/18; A61K 40/4252
See application file for complete search history.

(56) References Cited

U.S. PATENT DOCUMENTS

| | | | | |
|---|---|---|---|---|
| 10,763,298 | B2 * | 9/2020 | Nishimura | H10F 39/011 |
| 2007/0146910 | A1 * | 6/2007 | Duston | F24S 23/10 359/834 |
| 2010/0066812 | A1 * | 3/2010 | Kajihara | H04N 23/60 348/222.1 |
| 2014/0009647 | A1 * | 1/2014 | Hayashi | H01L 27/14621 348/266 |
| 2015/0102442 | A1 * | 4/2015 | Ootsuka | H10F 39/8057 257/432 |
| 2021/0057471 | A1 * | 2/2021 | Kim | H01L 27/14627 |
| 2021/0351218 | A1 * | 11/2021 | Kuo | H10F 39/807 |

FOREIGN PATENT DOCUMENTS

| | | | |
|---|---|---|---|
| KR | 20080100025 A * | 11/2008 | H10F 39/024 |

* cited by examiner

*Primary Examiner* — Georgia Y Epps
*Assistant Examiner* — Erin R Garber
(74) *Attorney, Agent, or Firm* — WPAT Law; Anthony King

(57) ABSTRACT

A semiconductor image-sensing structure includes a semiconductor substrate having a front side and a back side, a photo-sensing element disposed in the semiconductor substrate, a color filter disposed over the back side of the semiconductor substrate, and an electro-optical modulator disposed between the color filter and the photo-sensing element. The electro-optical modulator includes a first electrode, a second electrode over the first electrode, and a micro-lens between the first electrode and the second electrode.

20 Claims, 7 Drawing Sheets

SEMICONDUCTOR IMAGE-SENSING STRUCTURE HAVING ELECTRO-OPTICAL MODULATOR AND IMAGE SENSOR DEVICE HAVING THE SAME

BACKGROUND

An image sensor may be used to detect optical signals and convert the optical signals to electrical signals that may be further processed by another circuit. Photodiodes may be used in consumer electronics products, image sensors, data communications, phase detection auto focus application, time-of-flight applications, medical devices, and many other suitable applications.

BRIEF DESCRIPTION OF THE DRAWINGS

Aspects of the present disclosure are best understood from the following detailed description when read with the accompanying figures. It is emphasized that, in accordance with standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
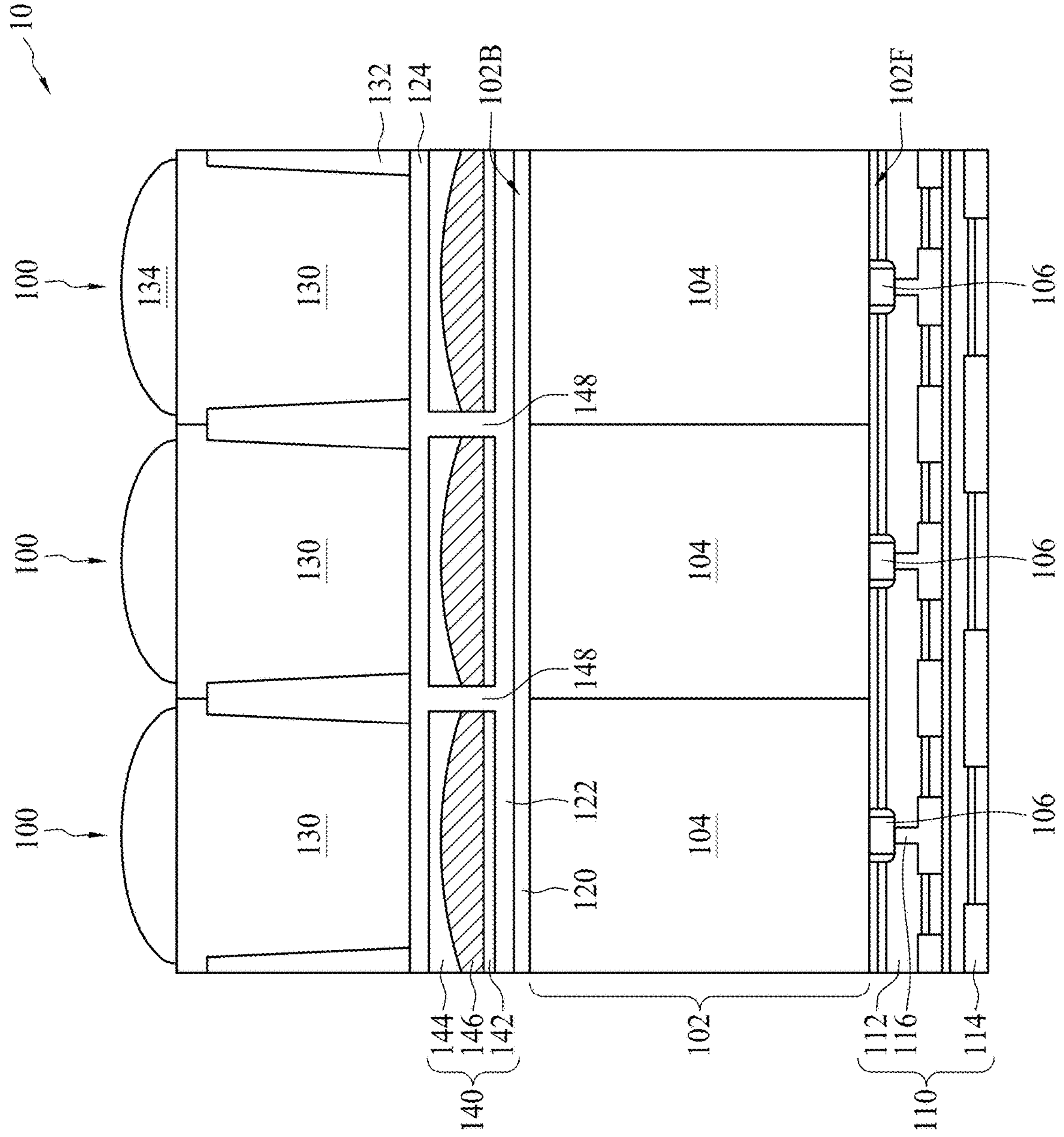
FIG. 1 is a schematic view of a semiconductor photo-sensing structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Time-of-flight ("TOF") measurement of a ray of light generated by a mono-chromatic or wide-spectral light source can be used in various applications, such as 3D imaging. The measurement is based on a detection of a light from a source which is reflected by a target to a detector. There exist at least two techniques to measure the TOF: a direct method and an indirect method. In the direct method, a time difference between a START pulse, synchronized with the light source, and a STOP signal generated by the detector is evaluated. In the indirect method, a continuous sinusoidal light wave is emitted and a phase difference between outgoing and incoming signals is measured, wherein the phase difference is used to determine the time difference using a predefined algorithm. In some comparative approaches, interference from neighboring sensors has been found to may adversely impact detection. For example, when a sensor receives an incoming signals, which is output from another sensor, a depth distortion issue may arise, and consequently causes degradation in accuracy and precision.

Phase detection auto focus ("PDAF") is used to quickly focus on an object by determining a distance to the object based on a phase difference of radiation incident on pairs of PDAF pixels. In some embodiments, a first PDAF pixel of the pair of PDAF pixels is partially shielded from incident radiation on a first sides, so angular response curves (ARCs) of the first PDAF pixel are offset from a reference angle in a first direction. An ARC describes sensitivity as a function of incident angle. A second PDAF pixel of the pair pf PDAF pixels is partially shielded from incident radiation on second sides, so ARCs of the second PDAF pixels are offset from the reference angle in a second direction opposite to the first direction. In some comparative approaches, a PDAF architecture has 3% to 6% coverage in an entire pixel array. Such limited pixel coverage increases time needed for focusing.

The present disclosure therefore provides a semiconductor image-sensing structure having an electro-optical modulator disposed between the color filter and the sensor. The electro-optical modulator may have various focal length in response to an applied electric field. Accordingly, the neighboring pixels may have different focal lengths, thus mitigating an interference issue. Further, the electro-optical modulator may have various refractive indices (also referred to as N value) in response to the applied electric field. Accordingly, the adjustable N value may further enhance quantum efficiency (QE) for infrared (IR) light. In some embodiments, for the PDAF architecture, PDAF pixel coverage may be increased, thereby reducing the time needed for focusing.

Figure 2:
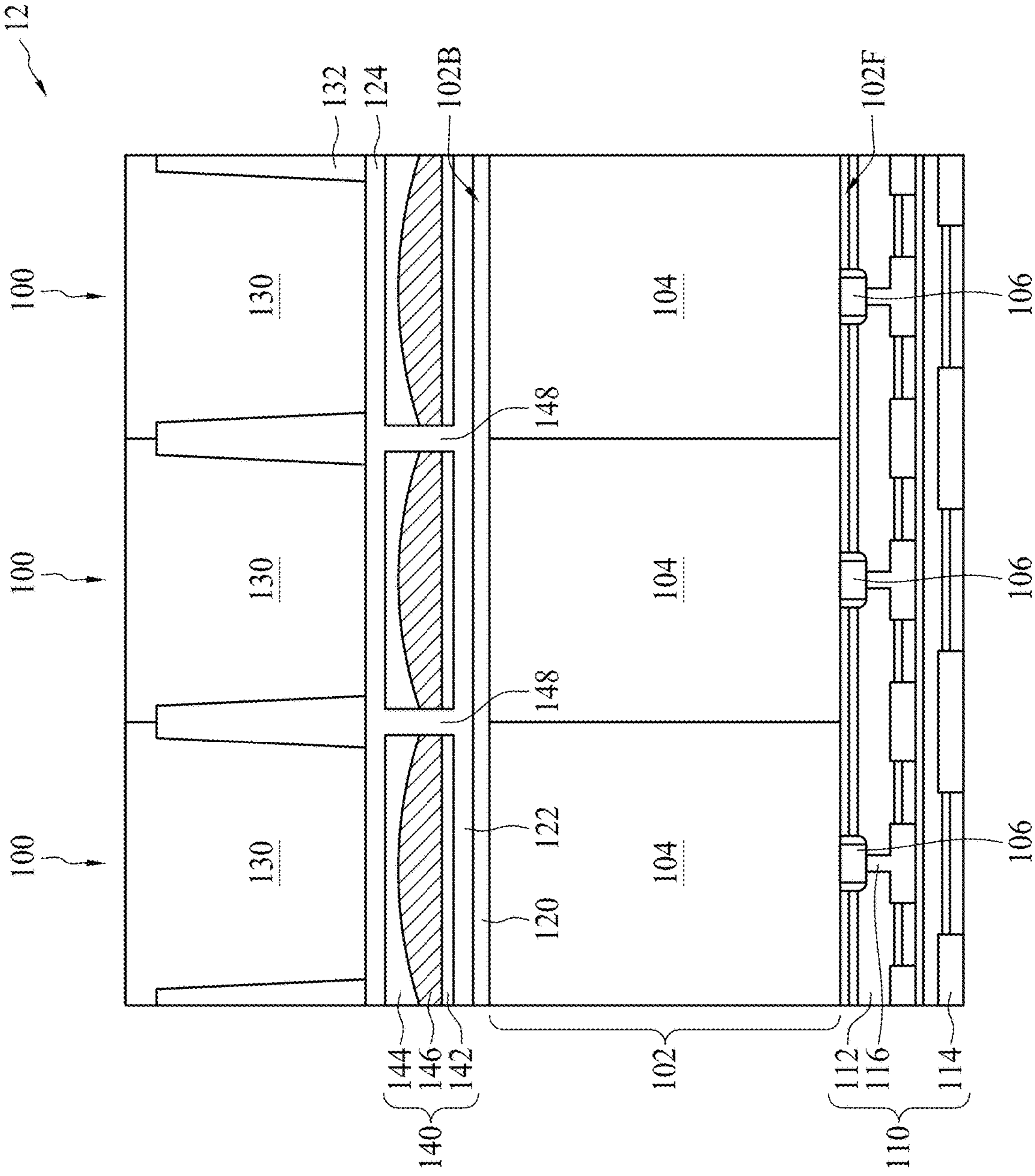
FIG. 2 is a schematic view of a semiconductor photo-sensing structure in accordance with some embodiments of the present disclosure.

Referring to FIGS. 1 and 2, image sensor devices 10 and 12 are provided. It should be noted that same elements shown in FIGS. 1 and 2 may be designated by same numerals. In some embodiments, the image sensor devices 10 and 12 may be CIS or active pixel sensor devices. In some embodiments, the image sensor devices 10 and 12 may be a charge-coupled devices (CCD) or passive pixel sensor devices. In some embodiments, the image sensor devices 10 and 12 are back-side illuminated (BSI) sensor devices. Each of the image sensor devices 10 and 12 includes a plurality of semiconductor image-sensing structures 100 arranged in an array for measuring an intensity or a brightness of radiation. In some embodiments, each of the semiconductor image-sensing structures 100 may include at least one photo-sensing element, such as a photodiode. In other embodiments, the semiconductor image-sensing structures 100 may include pinned photodiodes. In some embodiments, photogate detectors, phototransistors, and/or other detectors known in the art may be used as the semiconductor image-sensing structures 100. It should be understood that the image sensor devices 10 and 12 may include many hundreds or thousands of the semiconductor image-sensing structures 100 in a sensor array area. In some embodiments, readout circuits and pixel control circuits (i.e., logic drive circuits) may be disposed at sides of the array of the semiconductor image-sensing structures 100, though not shown.

As shown in FIGS. 1 and 2, the semiconductor image-sensing structure 100 includes a semiconductor substrate 102. The semiconductor substrate 102 has a front side 102F and a back side 102B opposite to the front side 102F. In some embodiments, the semiconductor substrate 102 may be formed of a semiconductor material such as silicon, germanium, diamond or like materials. Compound materials used for semiconductor substrates such as silicon germanium, silicon carbide, gallium arsenide, indium arsenide, indium phosphide, or combinations of these may be used. In alternative embodiments, the semiconductor substrate 102 may include a silicon on insulator (SOI) semiconductor substrate.

The semiconductor image-sensing structure 100 may include a photo-sensing element 104 such as a photodiode configured to convert light signals (photons) to electrical signals. The photo-sensing element 104 is disposed to receive light with a predetermined wavelength. In some embodiments, the photo-sensing element 104 is operated to sense visible light of incident light. In other embodiments, the photo-sensing element 104 is operated to sense infrared (IR) and/or near-infrared (NIR) of the incident light.

The semiconductor image-sensing structure 100 may include an isolation structure, such as a deep-trench isolation (DTI) structure (not shown), surrounding and between the photo-sensing elements 104. In some embodiments, the isolation structure may extend from the back side 102B into the semiconductor substrate 102. Further, the isolation structures separate the photo-sensing elements 104 from each other. In some embodiments, a depth of the isolation structure may be equal to a thickness of the semiconductor substrate 102, but the disclosure is not limited thereto. The isolation structure provides optical isolation between neighboring photo-sensing elements 104, thereby serving as a semiconductor substrate isolation grid and reducing cross-talk.

In some embodiments, logic devices 106, such as a transistor, can be disposed over the front side 102F of the semiconductor substrate 102. The transistor may be configured to enable readout of the photo-sensing element 104. In some embodiments, the transistor is a transfer transistor. The transfer transistor includes a gate structure and a source/drain region (not shown). The source/drain regions may refer to a source or a drain, individually or collectively, depending on context. The transistor may further include other elements such as spacers, and/or stressors of the source/drain regions, and the gate structure may further include elements such as a gate dielectric layer and a gate conductive layer. Descriptions of such details are omitted for brevity.

The semiconductor image-sensing structure 100 further includes a back-end-of-line (BEOL) interconnect structure 110 disposed over the front side 102F of the semiconductor substrate 102. The BEOL interconnect structure 110 (i.e., BEOL metallization layers 112) is electrically connected to the semiconductor photo-sensing structure 104. For example, the BEOL interconnect structure 110 electrically connects the transistor 106 to other circuits, as shown in FIGS. 1 and 2. Further, the BEOL interconnect structure 110 electrically connects the semiconductor photo-sensing structure 104 to other structures, devices or circuits. In some embodiments, the BEOL interconnect structure 110 includes a plurality of dielectric layers 112, and a plurality of metallization layers 114 and via conductors 116 disposed in the dielectric layers 112.

The semiconductor image-sensing structure 100 may include an anti-reflective coating (ARC) 120 disposed over the back side 102B of the semiconductor substrate 102, as shown in FIGS. 1 and 2. In some embodiments, the semiconductor photo-sensing structure 100 may include at least one passivation layer disposed over the ARC 120. For example, the semiconductor photo-sensing structure 100 includes a first passivation layer 122 and a second passivation layer 124 disposed over the ARC 120. The first and second passivation layers 122 and 124 provide a flat and even surface over the back side 102B of the semiconductor substrate 102.

The semiconductor image-sensing structure 100 further includes a color filter 130 disposed over the semiconductor substrate 102 on the back side 102B. Further, the color filter 130 is aligned with the photo-sensing element 104, as shown in FIGS. 1 and 2. The color filter 130 is configured to allow light beams within different wavelength ranges to pass through. For example, one of the color filters 130 is configured to allow light beams within a wavelength range of red light, green light, or blue light to pass through, but the disclosure is not limited thereto. In some embodiments, other colors of light may be allowed to exclusively pass through the color filter, but the disclosure is not limited thereto.

In some embodiments, an optical isolation grid 132 may be disposed between the color filters 130 on the back side 102B of the semiconductor substrate 102. The optical isolation grid 132 may surround each of the color filters 130. The color filters 130 may have a refractive index that is less than a refractive index of the optical isolation grid 132. It will be appreciated that due to the different refractive indices of the color filters 130 and the optical isolation grid 132, when light, such as photons, encounters an interface between the color filters 130 and the optical isolation grid 132, the light is reflected away from the optical isolation grid 132 and back into the color filters 130 or into the semiconductor substrate 102, such that the light is not directed toward an incorrect neighboring photo-sensing element 104. In some embodiments, the optical isolation grid 132 includes a low-n grid. In other embodiments, the optical isolation grid 132 includes a metal grid.

In some embodiments, the semiconductor image-sensing structure 100 further includes a micro-lens 134 disposed over the color filter 130, as shown in FIG. 1. In other words, the color filter 130 is disposed between the micro-lens 134 and the photo-sensing element 104. The micro-lens 134 is configured to focus light toward the photo-sensing element 104.

The semiconductor image-sensing structure 100 further includes an electro-optical (EO) modulator 140 disposed between the photo-sensing element 104 and the color filter 130. In some embodiments, the EO modulator 140 is disposed between the first passivation layer 122 and the second passivation layer 124. Accordingly, flat and even surfaces are obtained on both sides of the EO modulator 140. In some embodiments, the EO modulator 140 entirely covers the photo-sensing element 104, as shown in FIGS. 1 and 2.

The EO modulator 140 includes a first electrode 142, a second electrode 144 over the first electrode 142, and a micro-lens 146 between the first electrode 142 and the second electrode 144. The first and second electrodes 142 and 144 are electrically connected to a control circuit (not shown), thereby receiving voltages to generate an electric field. In some embodiments, the micro-lens 146 can be a plano-convex lens, as shown in FIGS. 1 and 2, but the disclosure is not limited thereto. For example, in other embodiments, the micro-lens 146 can be a biconvex lens. In some embodiments, a thickness of the micro-lens 146 of the EO modulator 140 is equal to a thickness of the micro-lens 146. In some alternative embodiments, the thickness of the micro-lens 146 of the EO modulator 140 is less than the thickness of the micro-lens 146.

The semiconductor image-sensing structure 100 further includes an isolation 148 surrounding the EO modulators 140. Further, the isolation 148 separates the EO modulators 140 from each other. In some embodiments, the optical isolation grid 132 overlaps the isolation 148 entirely, as shown in FIGS. 1 and 2.

In some embodiments, each of the first and second electrodes 142 and 144 may be formed of or include a conductive layer. In some embodiments, each of the first and second electrodes 142 and 144 may be formed of or include a transparent conductive material. In some embodiments, the transparent conductive material may include one or more transparent conductive oxides (TCO), such as indium tin oxide (ITO), antimony doped yin oxide (ATO), fluorine doped tin oxide (FTO), aluminum doped zinc oxide (AZO), gallium doped zinc oxide (GZO), indium doped zinc oxide (IZO), or the like. The first electrode 142 and the second electrode 144 may include a same material. In some alternative embodiments, the first electrode 142 and the second electrode 144 may include different materials.

In some embodiments, the micro-lens 146 may be or include a lens layer. In some embodiments, the micro-lens 146 may be or include one or more electro optical materials. The electro optical material may include potassium tantalate niobate (KTN), barium titanate ($BaTiO_3$), lead zirconium titanate (PZT), lead lanthanum zirconium titanate (PLZT), potassium niobate ($KNbO_3$), lithium niobate ($LiNbO_3$), barium strontium titanate ($(Ba,Sr)TiO_3$), polycrystalline strontium barium niobate ($Sr_xBa_{1-x}Nb_2O_6$), or the like.

The micro-lens 146 of the EO modulator 140 has a focal length that varies in response to the electric field applied thereto. In some embodiments, the change of the focal length is performed by varying the voltage applied to the first and second electrodes 142 and 144. The micro-lens 146 of the EO modulator 140 therefore has many advantages. For example, a response time is relatively short. Further, in contrast to the micro-lens 146 that has a fixed focal length, the variation range (or the working range) of the focal length of the micro-lens 146 is not limited to by space and provides more flexibility. In some embodiments the micro-lens 146 of the EO modulator 140 can replace the micro-lens 146, and hence a top surface of the color filter 130R, 130G and 130B is free of the micro-lens, as shown in FIG. 2.

More than providing the various focal lengths, in some embodiments, when the image sensor device 10 and 12 are used in an iToF application, the EO modulator 140 provides phase differences between neighboring semiconductor photo-sensing structures 100 thereby mitigating an interference issue. In some embodiments, the EO modulator 140 provides a different refractive index such that quantum efficiency of IR is improved.

Figure 3:
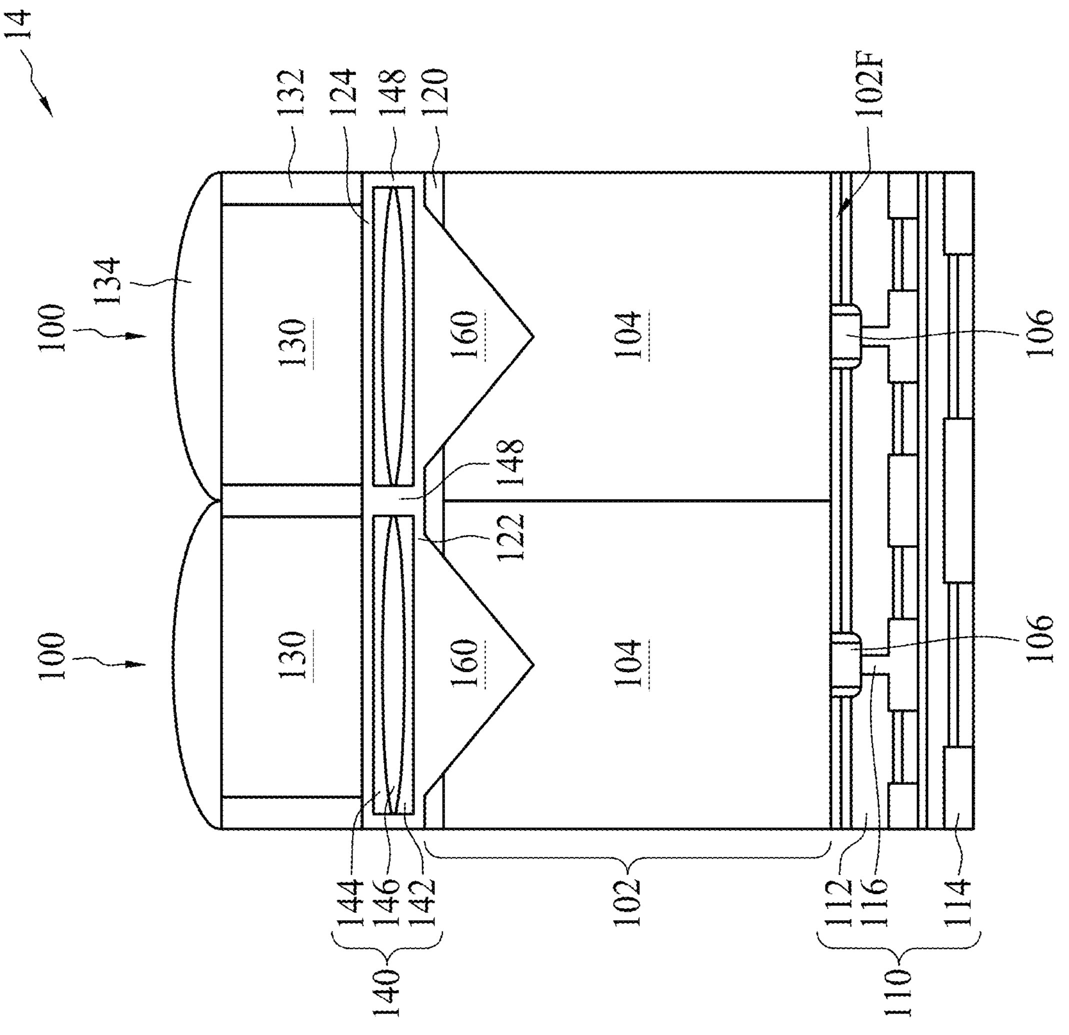
FIG. 3 is a schematic view of a semiconductor photo-sensing structure in accordance with some embodiments of the present disclosure.
Figure 4:
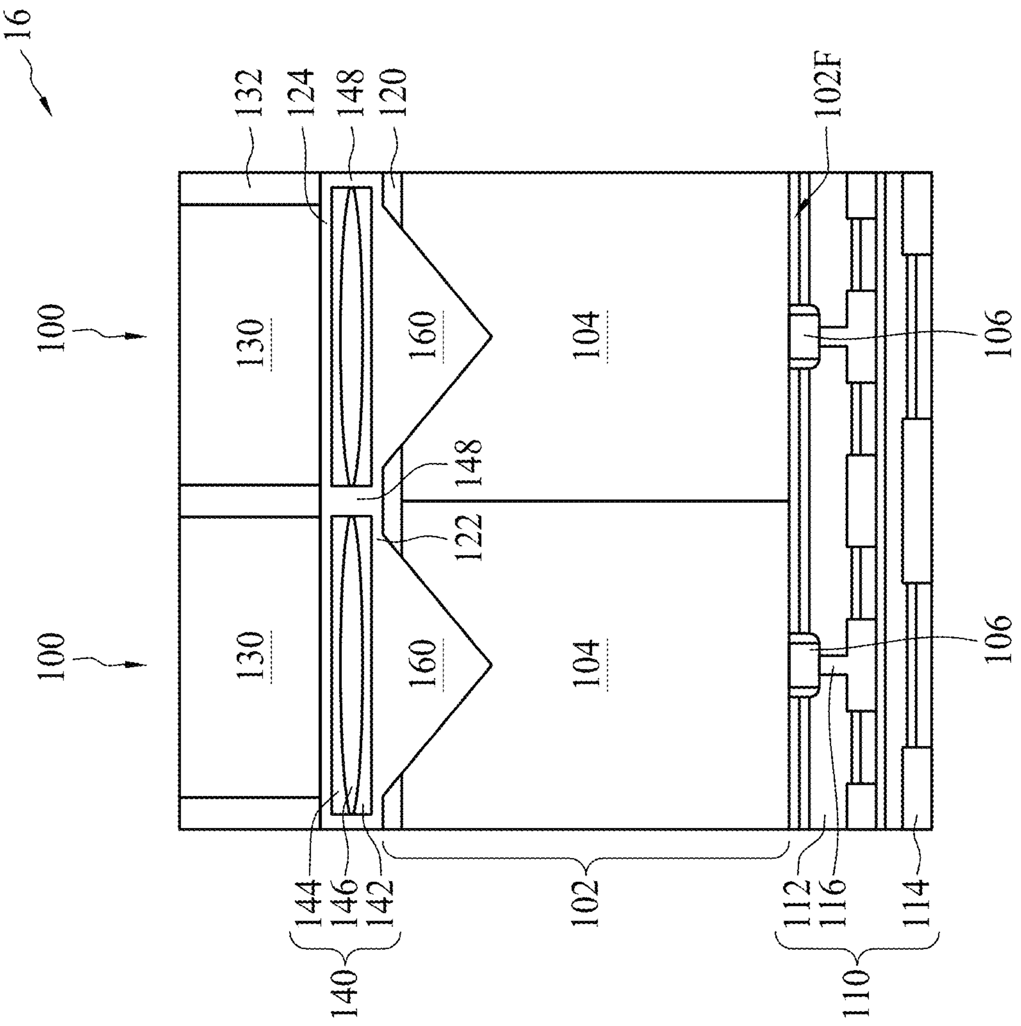
FIG. 4 is a schematic view of a semiconductor photo-sensing structure in accordance with some embodiments of the present disclosure.

Referring to FIGS. 3 and 4, image sensor devices 14 and 16 are provided. It should be noted that same elements shown in FIGS. 1 to 4 may be designated by same numerals and include same materials; therefore, such details are omitted hereinafter. Each of the image sensor devices 14 and 16 includes a plurality of the semiconductor image-sensing structures 100 arranged in the array for measuring an intensity or a brightness of radiation. As mentioned above, each of the semiconductor image-sensing structures 100 may include at least one photo-sensing element 104. It should be understood that the image sensor devices 14 and 16 may include many hundreds or thousands of semiconductor image-sensing structures 100 in a sensor array area. In some embodiments, readout circuits and pixel control circuits (i.e., logic drive circuits) may be disposed at sides of the array of the semiconductor image-sensing structures 100, though not shown.

As shown in FIGS. 3 and 4, the semiconductor image-sensing structure 100 includes a semiconductor substrate 102. The semiconductor substrate 102 has a front side 102F and a back side 102B opposite to the front side 102F. The semiconductor image-sensing structure 100 may include a photo-sensing element 104 such as a photodiode configured to convert light signals (photons) to electrical signals. As mentioned above, the semiconductor image-sensing structure 100 may include an isolation structure, such as a DTI structure (not shown), surrounding and between the photo-sensing elements 104. The isolation structure provides optical isolation between neighboring photo-sensing elements 104, thereby serving as a semiconductor substrate isolation grid and reducing cross-talk.

In some embodiments, logic devices 106, such as a transistor, can be disposed over the front side 102F of the semiconductor substrate 102. The semiconductor image-sensing structure 100 further includes a BEOL interconnect structure 110 disposed over the front side 102F of the semiconductor substrate 102. In some embodiments, the BEOL interconnect structure 110 includes a plurality of dielectric layers 112, and a plurality of metallization layers 114 and via conductors 116 disposed in the dielectric layers 112.

The semiconductor image-sensing structure 100 may include an ARC 120 disposed over the back side 102B of the semiconductor substrate 102, as shown in FIGS. 3 and 4. In some embodiments, the semiconductor image-sensing structure 100 may include at least one passivation layer disposed over the ARC 120. For example, the semiconductor image-sensing structure 100 includes a first passivation layer 122 and a second passivation layer 124 disposed over the ARC 120. The first and second passivation layers 122 and 124 provide a flat and even surface over the back side 102B of the semiconductor substrate 102.

The semiconductor image-sensing structure 100 further includes a color filter 130 disposed over the semiconductor substrate 102 on the back side 102B. Further, the color filter 130 is aligned with the photo-sensing element 104, as shown in FIGS. 3 and 4. In some embodiments, an optical isolation grid 132 may be disposed between the color filters 130 on the back side 102B of the semiconductor substrate 102. The optical isolation grid 132 may surround each of the color filters 130. In some embodiments, the optical isolation grid 132 includes a low-n grid. In other embodiments, the optical isolation grid 132 includes a metal grid.

In some embodiments, the semiconductor image-sensing structure 100 further includes a micro-lens 134 disposed over the color filter 130, as shown in FIG. 3.

The semiconductor image-sensing structure 100 further includes an EO modulator 140 disposed between the photo-sensing element 104 and the color filter 130. In some embodiments, the EO modulator 140 is disposed between the first passivation layer 122 and the second passivation layer 124. Accordingly, flat and even surfaces are obtained on both sides of the EO modulator 140. In some embodiments, the EO modulator 140 entirely covers the photo-sensing element 104, as shown in FIGS. 3 and 4.

The EO modulator 140 includes a first electrode 142, a second electrode 144 over the first electrode 142, and a micro-lens 146 between the first electrode 142 and the second electrode 144. The first and second electrodes 142 and 144 are electrically connected to a control circuit (not shown), thereby receiving voltages to generate an electric field. In some embodiments, the micro-lens 146 can be a biconvex lens, as shown in FIGS. 3 and 4, but the disclosure is not limited thereto. In some embodiments, the micro-lens 146 can be a plano-convex lens. The semiconductor image-sensing structure 100 includes an isolation 148 surrounding the EO modulators 140. Further, the isolation 148 separates the EO modulator 140 from each other. In some embodiments, the optical isolation grid 132 overlaps the isolation 148 entirely, as shown in FIGS. 3 and 4.

In some embodiments, the semiconductor image-sensing structure 100 further includes a dielectric structure 160 disposed between the photo-sensing element 104 and the passivation layer (i.e., the first passivation layer 122) or between the photo-sensing element 104 and the EO modulator 140. The dielectric structure 160 may include a material same as that of the passivation layer, the DTI structure or the isolation 148. In some embodiments, the dielectric structure 160 may penetrate the ARC 120 and may have slanted sides. In some embodiments, the slanted sides of the dielectric structure 160 may form an intersection point over the photo-sensing element 104. The dielectric structure 160 may help to focus light toward the photo-sensing element 104.

As mentioned above, the micro-lens 146 of the EO modulator 140 has a focal length that varies in response to the electric field applied thereto. In some embodiments the micro-lens 146 of the EO modulator 140 can replace the micro-lens 134 hence a top surface of the color filter 130 is free of the micro-lens 134, as shown in FIG. 4. Further, when the image sensor devices 14 and 16 are used in an i-ToF application, the EO modulator 140 provides a phase difference between neighboring semiconductor image-sensing structures 100, thereby mitigating the interference issue. In some embodiments, the EO modulator 140 provides different refractive index such that quantum efficiency of IR is improved.

Figure 5:
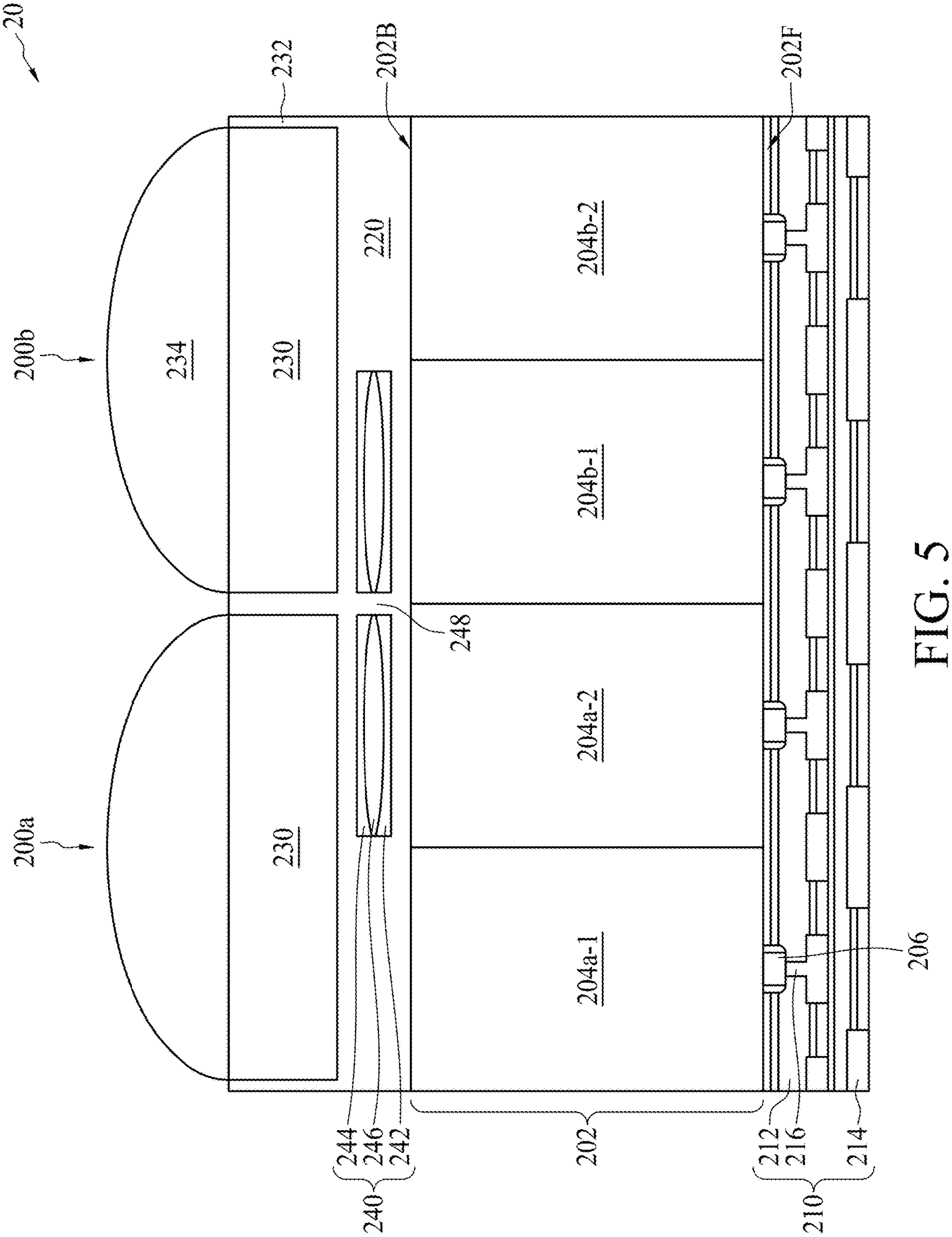
FIG. 5 is a schematic view of a semiconductor photo-sensing structure in accordance with some embodiments of the present disclosure.

Referring to FIG. 5, an image sensor device 20 is are provided. It should be noted that same elements shown in FIGS. 1 to 5 may include same materials; therefore, those details are omitted for brevity.

In some embodiments, the image sensor device 20 is provided for a PDAF application. In such embodiments, the image sensor device 20 includes at least two semiconductor image-sensing structures 200*a* and 200*b* that work together as a pair for phase detection. In some embodiments, each of the semiconductor image-sensing structures 200 and 200*b* may include at least one photo-sensing element, such as a photodiode. In some embodiments, each of the semiconductor image-sensing structures 200*a* and 200*b* include two sub-pixels, and each of the sub-pixels includes a photo-sensing structure. For example, in some embodiments, the semiconductor image-sensing structure 200*a* includes two photo-sensing elements 204*a*-1 and 204*a*-2 adjacently disposed, and the semiconductor image-sensing structure 200*b* includes two photo-sensing elements 204*b*-1 and 204*b*-2 adjacently disposed.

As shown in FIG. 5, each of the semiconductor image-sensing structure 200*a* includes a semiconductor substrate 202. The semiconductor substrate 202 has a front side 202F and a back side 202B opposite to the front side 202F. The photo-sensing elements 204*a*-1, 204*a*-2, 204*b*-1 and 204*b*-2 are disposed in the semiconductor substrate 202. Isolation structures such as DTI structures (not shown) are disposed to separate the photo-sensing elements 204*a*-1, 204*a*-2, 204*b*-1 and 204*b*-2 from each other. The isolation structures provide optical isolation between neighboring photo-sensing elements 204*a*-1, 204*a*-2, 204*b*-1 and 204*b*-2, thereby serving as a semiconductor substrate isolation grid and reducing cross-talk.

In some embodiments, logic devices 206 may be disposed over the front side 202F of the semiconductor substrate 202. A BEOL interconnect structure 210 is disposed over the front side 202F of the semiconductor substrate 202. The BEOL interconnect structure 210 includes a plurality of dielectric layers 212, and a plurality of metallization layers 214 and via conductors 216 disposed in the dielectric layers 212.

An ARC (not shown) may be disposed over the back side 202B of the semiconductor substrate 202. A passivation layer 220 may be disposed over the ARC over the back side 202B of the semiconductor substrate 202. As mentioned above, the passivation layer 220 provides a flat and even surface over the back side 202B of the semiconductor substrate 202.

A plurality of color filters 230 are disposed over the semiconductor substrate 202 on the back side 202B. In some embodiments, the two photo-sensing elements 204*a*-1 and 204*a*-2 of the semiconductor image-sensing structure 200*a* share one color filter 230, and the two photo-sensing elements 204*b*-1 and 204*b*-2 of the semiconductor image-sensing structure 200*b* share one color filter 230. That is, the color filter 230 overlaps the two photo-sensing elements 204*a*-1 and 204*a*-2 of the semiconductor image-sensing structure 200*a*, and the color filter 230 overlaps the two photo-sensing elements 204*b*-1 and 204*b*-2 of the semiconductor image-sensing structure 200*b*, but the disclosure is not limited thereto. In other embodiments, color filters may overlap each of the photo-sensing elements. The arrangements of the color filters 230 and the photo-sensing elements 204*a*-1, 204*a*-2, 204*b*-1, and 204*b*-2 can be modified depending on different product designs.

In some embodiments, an optical isolation grid 232 may be disposed between the color filters 230 on the back side 202B of the semiconductor substrate 202. As mentioned above, the optical isolation grid 232 surrounds the color filters 230. In some embodiments, the optical isolation grid 232 includes a low-n grid. In other embodiments, the optical isolation grid 232 includes a metal grid.

In some embodiments, a plurality of micro-lenses 234 are disposed over the color filters 230, as shown in FIG. 5. A number of the micro-lenses 234 may be equivalent to a number of the color filters 230, but the disclosure is not limited thereto. The arrangements of the micro-lenses 234 and the photo-sensing elements 204*a*-1, 204*a*-2, 204*b*-1, and 204*b*-2 can be modified depending on different product designs.

Each of the semiconductor image-sensing structures 200*a* and 200*b* further includes an electro-optical (EO) modulator 240 inserted in the passivation layer 220. For the semiconductor image-sensing structure 200*a*, the EO modulator 240 entirely covers the photo-sensing element 204*a*-2 but is absent from the photo-sensing element 204*a*-1. For the semiconductor image-sensing structure 200*b*, the EO modulator 240 entirely covers the photo-sensing element 204*b*-1 but is absent from the photo-sensing element 204*b*-2. In some embodiments, the two EO modulators 240 are disposed over adjacent photo-sensing elements 204*a*-2 and 204*b*-1, and the photo-sensing element 242*a*-2 and the photo-sensing element 204*b*-1 are disposed between the photo-sensing element 242*a*-1 and the photo-sensing element 242*b*-2, but the disclosure is not limited thereto.

The EO modulator 240 includes a first electrode 242, a second electrode 244 over the first electrode 242, and a micro-lens 246 between the first electrode 242 and the second electrode 244. The first and second electrodes 242 and 244 are electrically connected to a control circuit (not shown), thereby receiving voltages to generate an electric field. In some embodiments, the micro-lens 246 can be a plano-convex lens. In some embodiments, the micro-lens 246 can be a biconvex lens, as shown in FIG. 5. In some embodiments, a thickness of the micro-lens 246 of the EO modulator 240 is equal to a thickness of the micro-lens 234. In some alternative embodiments, the thickness of micro-lens 246 of the EO modulator 240 is less than the thickness of the micro-lens 234, as shown in FIG. 5. Each of the semiconductor image-sensing structures 200*a* and 200*b* further includes an isolation 248 separating the EO modulators 240 from each other. In some embodiments, the optical isolation grid 232 overlaps the isolation 248 entirely, as shown in FIG. 5.

In a PDAF application, the semiconductor image-sensing structures 200*a* and 200*b* work for different eyes. For example, the semiconductor image-sensing structure 200*a* may work for the left eye, and the semiconductor image-sensing structure 200*b* for the right eye. Further, the EO modulator 240 over the photo-sensing element 204*a*-2 provides a phase different from that provided for the photo-sensing element 204*a*-1. Similarly, the EO modulator 240 over the photo-sensing element 204*b*-1 provides a phase different from that provided for the photo-sensing element 204*b*-2. Accordingly, phase detection for both eyes is obtained.

Figure 6:
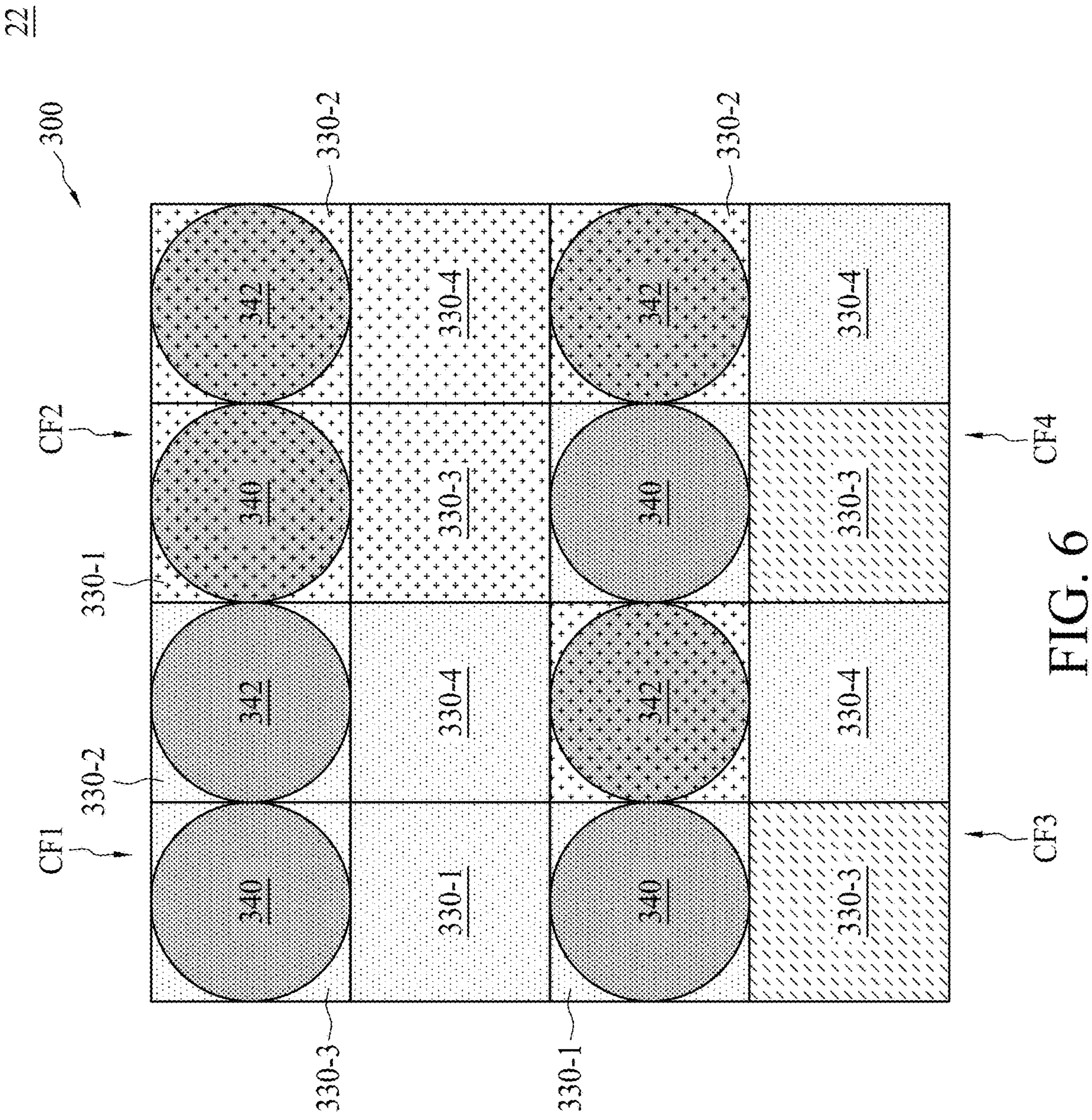
FIG. 6 is a plan view of a semiconductor photo-sensing structure in accordance with some embodiments of the present disclosure.

Please refer to FIG. 6, which is a plan view of an image sensor device 22. It should be noted that same elements in FIGS. 5 and 6 are omitted for brevity. Though FIG. 6 shows only a plan view of the image sensor device 22, those skilled in the art would easily realize the cross-sectional view of the image sensor device 22 according to the abovementioned descriptions.

In some embodiments, the image sensor device 22 includes a color filter pattern 300, and the color filter pattern 300 includes a first unit CF1, a second unit CF2, a third unit CF3 and a fourth unit CF4 arranged to form a square. In some embodiments, the first to fourth units CF1 to CF4 are arranged to form a Bayer pattern, unit-by-unit. In some embodiments, each of the first unit CF1, the second unit CF2, the third unit CF3, and the fourth unit CF4 includes four color filters 330-1, 330-2, 330-3 and 330-4 arranged to form a square. Further, a plurality of photo-sensing elements may be disposed under the color filter pattern 300, and a number of the photo-sensing elements is equal to a number of the color filters 330-1, 330-2, 330-3 and 330-4 in the color filter pattern 300. In such embodiments, each of the color filters 330-1, 330-2, 330-3 and 330-4 overlaps one photo-sensing elements, but the disclosure is not limited.

In some embodiments, an EO modulator 340 is overlapped by the color filter 330-1 in each of the first unit CF1, the second unit CF2, the third unit CF3 and the fourth unit CF4. Another EO modulator 342 is overlapped by the color filter 330-2 in each of the first unit CF1, the second unit CF2, the third unit CF3 and the fourth unit CF4. As shown in FIG. 6, the color filter 330-1 and the color filter 330-2 in each units are arranged left-to-right. Accordingly, the EO modulators 340 and 342 are arranged left-to-right.

The EO modulators 340 and 342 are separated from each other. In some embodiments, an isolation as shown in FIG. 5 is provided to separate the EO modulators 340 and 342 from each other.

In some embodiments, the color filters 330-1 to 330-4 are configured to allow light beams within a same wavelength range to pass through. For example, the color filters 330-1 to 330-4 in the first unit CF1 allow green light to pass through while the color filters 330-1 to 330-4 in the second unit CF2 allow red light to pass through. In such embodiments, the EO modulators 340 and 342 in the first unit CF1 provide phase detection of a same color (i.e., green) respectively for left and right eyes, while the EO modulators 340 and 342 in the second unit CF2 provide phase detection of a same color (i.e., red) respectively for left and right eyes.

In some embodiments, the color filters 330-1 to 330-4 are configured to allow light beams within different wavelength ranges to pass through. For example, the color filters 330-1 and 330-4 in the third and fourth units CF3 and CF4 allow green light to pass through while the color filters 330-2 in the third and fourth units CF3 and CF4 allow red light to pass through and the color filters 330-4 in the third and fourth units CF3 and CF4 allow blue light to pass through. As shown in FIG. 6, the color filters 330-1 and 330-4 are diagonally arranged, and the color filters 330-2 and 330-3 are diagonally arranged. In such embodiments, the green image is measured at a higher sampling rate because the peak sensitivity of the human visual system lies in the medium wavelengths, corresponding to the green portion of the spectrum. Further, in such embodiments, the EO modulators 340 and 342 in the third unit CF3 and the fourth unit CF4 provide phase detection for different colors.

Figure 7:
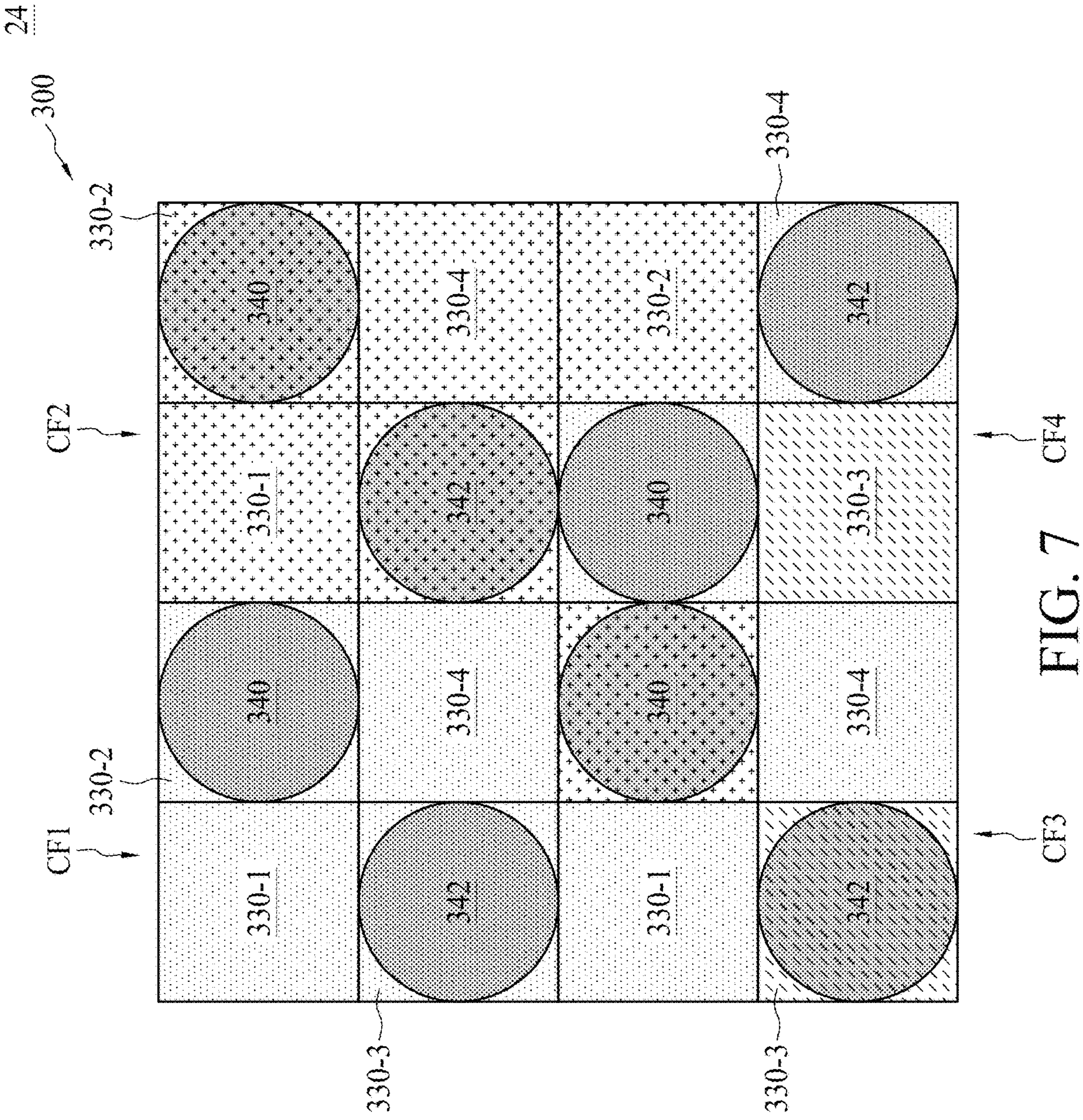
FIG. 7 is a plan view of a semiconductor photo-sensing structure in accordance with some embodiments of the present disclosure.

It should be noted that arrangement of the EO modulators 340 and 342 is not limited thereto. Please refer to FIG. 7, which is a plan view of an image sensor device 24. It should be noted that same elements in FIGS. 6 and 7 are omitted for brevity. Although FIG. 7 shows only a plan view of the image sensor device 24, though skilled in the art would easily realize the cross-sectional view of the image sensor device 24 according to the abovementioned descriptions.

In some embodiments, the image sensor device 24 includes a color filter pattern 300, and the color filter pattern 300 includes a first unit CF1, a second unit CF2, a third unit CF3 and a fourth unit CF4 arranged to form a square. In some embodiments, the first to fourth units CF1 to CF4 are arranged to form a Bayer pattern, unit-by-unit. In some embodiments, each of the first unit CF1, the second unit CF2, the third unit CF3, and the fourth unit CF4 includes four color filters 330-1, 330-2, 330-3 and 330-4 arranged to form a square. Further, a plurality of photo-sensing elements may be disposed under the color filter pattern 300, and a number of the photo-sensing elements is equal to a number of the color filters 330-1, 330-2, 330-3 and 330-4 in the color filter pattern 300. In such embodiments, each of the color filters 330-1, 330-2, 330-3 and 330-4 overlaps one photo-sensing elements, but the disclosure is not limited.

In some embodiments, an EO modulator 340 is overlapped by the color filter 330-2 in each of the first unit CF1, the second unit CF2 and the third unit CF3. Another EO modulator 342 is overlapped by the color filter 330-3 in each of the first unit CF1, the second unit CF2 and the third unit CF3. As shown in FIG. 7, the color filter 330-2 and the color filter 330-3 in each unit are diagonally arranged. Accordingly, the EO modulators 340 and 342 are diagonally arranged. However, the EO modulators 340 and 342 are separated from each other. In some embodiments, an isolation as shown in FIG. 5 is provided to separate the EO modulators 340 and 342 from each other.

In some embodiments, an EO modulator 340 is overlapped by the color filter 330-2 in the fourth unit CF4, and another EO modulator 342 is overlapped by the color filter 330-3 in the fourth unit CF4. But the disclosure is not limited thereto. In other embodiments, an EO modulator 340 is overlapped by the color filter 330-1 in the fourth unit CF4, and another EO modulator 342 is overlapped by the color filter 330-4 in the fourth unit CF, as shown in FIG. 7.

In some embodiments, the color filters 330-1 to 330-4 are configured to allow light beams within a same wavelength range to pass through. For example, the color filters 330-1 to 330-4 in the first unit CF1 allow green light to pass through while the color filters 330-1 to 330-4 in the second unit CF2 allow red light to pass through. In such embodiments, the EO modulators 340 and 342 in the first unit CF1 provide phase detection of a same color (i.e, green) respectively for left and right eyes, while the EO modulators 340 and 342 in the second unit CF2 provide phase detection of a same color (i.e., red) respectively for left and right eyes.

In some embodiments, the color filters 330-1 to 330-4 are configured to allow light beams within different wavelength ranges to pass through. For example, the color filters 330-1 and 330-4 in the third and fourth units CF3 and CF4 allow green light to pass through while the color filters 330-2 in the third and fourth units CF3 and CF4 allow red light to pass through, and the color filters 330-4 in the third and fourth units CF3 and CF4 allow blue light to pass through. As shown in FIG. 7, the color filters 330-1 and 330-4 are diagonally arranged, and the color filters 330-2 and 330-3 are diagonally arranged. In such embodiments, the green image is measured at a higher sampling rate because the peak sensitivity of the human visual system lies in the medium wavelengths, corresponding to the green portion of the spectrum. Further, in such embodiments, the EO modulators 340 and 342 in the third unit CF3 provide phase detection for different colors.

The present disclosure therefore provides a semiconductor image-sensing structure having an electro-optical modulator disposed between a color filter and a sensor. The electro-optical modulator may have various focal lengths in response to an applied electric field. Accordingly, neighboring pixels may have different focal lengths, thus mitigating an interference issue. Further, the electro-optical modulator may have various refractive indices (also referred to as N values) in response to the applied electric field. Accordingly, the adjustable N value may further enhance QE for infrared (IR) light. In some embodiments, for a PDAF architecture, a PDAF pixel coverage may be increased, thereby reducing a time needed for focusing.

In some embodiments, a semiconductor image-sensing structure is provided. The semiconductor image-sensing structure includes a semiconductor substrate having a front side and a back side, a photo-sensing element disposed in the semiconductor substrate, a color filter disposed over the back side of the semiconductor substrate, and an EO modulator disposed between the color filter and the photo-sensing element. The EO modulator includes a first electrode, a second electrode over the first electrode, and a micro-lens between the first electrode and the second electrode.

In some embodiments, an image sensor device is provided. The image sensor device includes a semiconductor substrate, a first photo-sensing element and a second photo-sensing element disposed in the semiconductor substrate, a first color filter disposed over the first photo-sensing element and a second color filter disposed over the second photo-sensing element on the back side of the semiconductor substrate, a first EO modulator between the first photo-sensing element and the first color filter, and a second EO modulator between the second photo-sensing element and the second color filter. Each of the first EO modulator and the second EO modulator includes a first electrode, a second electrode over the first electrode and a micro-lens between the first electrode and the second electrode. The first EO modulator and the second EO modulator are separated from each other.

In some embodiments, an image sensor device is provided. The image sensor device includes a color filter pattern, a first EO modulator and a second EO modulator. The color filter pattern includes a first unit, a second unit, a third unit and a fourth unit arranged to form a square. Each of the first unit, the second unit, the third unit and the fourth unit includes four color filters arranged to form a square. The first EO modulator is overlapped by a first color filter in each of the first unit, the second unit, the third unit and the fourth unit. The second EO modulator is overlapped by a second color filter in each of the first unit, the second unit, the third unit and the fourth unit. The first color filter and the second color filter are arranged left-to-right or arranged diagonally.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor image-sensing structure, comprising:
- a semiconductor substrate having a front side and a back side;
- a first photo-sensing element and a second photo-sensing element adjacent to each other and disposed in the semiconductor substrate;
- a logic device disposed on the front side of the semiconductor substrate;
- a color filter disposed over the back side of the semiconductor substrate and overlapping the first photo-sensing element and the second photo-sensing element;
- an electro-optical (EO) modulator disposed on the back side of the semiconductor substrate, between the first photo-sensing element and the color filter, wherein the electro-optical modulator comprises:
  - a first electrode;
  - a second electrode over the first electrode; and
  - a micro-lens between the first electrode and the second electrode; and
- an anti-reflective coating (ARC) disposed between the electro-optical modulator and the back side of the semiconductor substrate,
- wherein the first photo-sensing element is overlapped by the electro-optical modulator, and
- the second photo-sensing element is free of overlapping the electro-optical modulator.

2. The semiconductor image-sensing structure of claim 1, further comprising a first passivation layer and a second passivation layer disposed between the color filter and the first photo-sensing element and between the color filter and the second photo-sensing element, wherein the electro-optical modulator is disposed between the first passivation layer and the second passivation layer.

3. The semiconductor image-sensing structure of claim 1, further comprising a second micro-lens disposed over the color filter, wherein the color filter is disposed between the second micro-lens and the electro-optical modulator.

4. The semiconductor image-sensing structure of claim 3, wherein a thickness of the micro-lens of the electro-optical modulator is equal to or less than a thickness of the second micro-lens.

5. The semiconductor image-sensing structure of claim 1, wherein the color filter has a first portion overlapping the first photo-sensing element and a second portion overlapping the second photo-sensing element.

6. The semiconductor image-sensing structure of claim 5, wherein the first portion of the color filter overlaps the electro-optical modulator, and the second portion of the color filter is free of overlapping the electro-optical modulator.

7. The semiconductor image-sensing structure of claim 1, wherein the micro-lens of the electro-optical modulator comprises various focal lengths in response to an electric field.

8. The semiconductor image-sensing structure of claim 1, wherein each of the first electrode and the second electrode comprises a transparent conductive material.

9. An image sensor device, comprising:
- a semiconductor substrate;
- a first logic device and a second logic device disposed on a front side of the semiconductor substrate;
- a first photo-sensing element and a second photo-sensing element disposed in the semiconductor substrate;
- a third photo-sensing element adjacent to the first photo-sensing element and a fourth photo-sensing element adjacent to the second photo-sensing element disposed in the semiconductor substrate, wherein the first photo-sensing element and the second photo-sensing element are disposed between the third photo-sensing element and the fourth photo-sensing element;
- a first color filter disposed over the first photo-sensing element and the third photo-sensing element, and a second color filter disposed over the second photo-sensing element and the fourth photo-sensing element on a back side of the semiconductor substrate, wherein the back side is opposite to the front side; and
- a first electro-optical modulator disposed between the first photo-sensing element and the first color filter, and a second electro-optical modulator disposed between the second photo-sensing element and the second color filter, wherein each of the first electro-optical modulator and the second electro-optical modulator comprises:
  - a first electrode;
  - a second electrode over the first electrode; and
  - a micro-lens between the first electrode and the second electrode,
- wherein the first electro-optical modulator and the second electro-optical modulator are separated from each other,
- wherein first photo-sensing element is overlapped by the first electro-optical modulator and
- the third photo-sensing element is free of overlapping the first electro-optical modulator, and
- the second photo-sensing element is overlapped by the second electro-optical modulator and
- the fourth photo-sensing element is free of overlapping the second electro-optical modulator.

10. The image sensor device of claim 9, wherein the first electro-optical modulator entirely covers the first photo-sensing element, and the second electro-optical modulator entirely covers the second photo-sensing element.

11. The image sensor device of claim 9, further comprising an isolation separating the first electro-optical modulator from the second electro-optical modulator.

12. The image sensor device of claim 11, further comprising an optical isolation grid separating the first color filter and the second color filter, wherein the optical isolation grid overlaps the isolation.

13. The image sensor device of claim 9, wherein the first color filter is configured to allow light beams within a first wavelength range to pass through, the second color filter is configured to allow light beams within a second wavelength range to pass through, and the first wavelength range and the second wavelength range are the same.

14. The image sensor device of claim 9, wherein the first color filter is configured to allow light beams within a first wavelength range to pass through, the second color filter is configured to allow light beams within a second wavelength range different from the first wavelength range to pass through.

15. The image sensor device of claim 9, further comprising:

a passivation layer disposed over the semiconductor substrate on the back side, wherein the first electro-optical modulator and the second electro-optical modulator are embedded in the passivation layer.

16. The image sensor device of claim 15, wherein the passivation layer comprises:

first portions overlapping the first photo-sensing element and the second photo-sensing element; and second portions overlapping the third photo-sensing element and the fourth photo-sensing element, wherein a thickness of the first portion is different from a thickness of the second portion.

17. An image sensor device, comprising:

a color filter pattern comprising a first unit, a second unit, a third unit and a fourth unit arranged to form a square, wherein each of the first unit, the second unit, the third unit, and the fourth unit comprises four color filters arranged to form a square;

a first electro-optical modulator overlapped by a first color filter in each of the first unit, the second unit, the third unit and the fourth unit; and a second electro-optical modulator overlapped by a second color filter in each of the first unit, the second unit, the third unit and the fourth unit, wherein the first color filter and the second color filter are arranged left-to-right or arranged diagonally, and wherein a third color filter and a fourth color filter in each of the first unit, the second unit, the third unit and the fourth unit are free of overlapping electro-optical modulator.

18. The image sensor device of claim 17, wherein the first color filter and the second color filter are configuration to allow light beams within a same wavelength range to pass through.

19. The image sensor device of claim 17, wherein the first color filter and the second color filter are configured to allow light beams within different wavelength ranges to pass through.

20. The image sensor device of claim 17, further comprising a plurality of photo-sensing elements, and wherein a number of the photo-sensing elements is equal to a number of the color filters in the color filter pattern.

* * * * *